United States Patent
Kang

(10) Patent No.: US 7,009,866 B2
(45) Date of Patent: Mar. 7, 2006

(54) NONVOLATILE MEMORY DEVICE USING SERIAL DIODE CELL

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/024,880

(22) Filed: Dec. 30, 2004

(65) Prior Publication Data

US 2005/0169036 A1    Aug. 4, 2005

(30) Foreign Application Priority Data

Jan. 29, 2004  (KR) .................. 10-2004-0005631

(51) Int. Cl.
*G11C 11/12*  (2006.01)

(52) U.S. Cl. ................. 365/145; 365/175; 365/230.03; 257/46; 257/295

(58) Field of Classification Search ................ 365/145, 365/175, 230.03; 257/46, 295, E21.663
See application file for complete search history.

(56) References Cited

U.S. PATENT DOCUMENTS 5,822,240 A * 10/1998 Yoo ........................... 365/145
5,926,412 A * 7/1999 Evans et al. ................. 365/145
6,151,241 A * 11/2000 Hayashi et al. ............. 365/145
6,256,220 B1 * 7/2001 Kamp ........................ 365/145
6,272,594 B1   8/2001 Gupta et al.
6,363,439 B1   3/2002 Battles et al.
6,859,088 B1 * 2/2005 Toyoda et al. .............. 327/427
2003/0174532 A1 * 9/2003 Matsushita et al. ......... 365/145

FOREIGN PATENT DOCUMENTS

KR   1020030024223 A   3/2003

* cited by examiner

*Primary Examiner*—Hoai Ho
(74) *Attorney, Agent, or Firm*—Heller Ehrman LLP

(57) ABSTRACT

A nonvolatile memory device features a serial diode cell by effectively arranging a cross point cell array including a nonvolatile ferroelectric capacitor and a serial PN diode chain to reduce the whole memory size. A serial diode cell array including a nonvolatile ferroelectric capacitor and a serial diode switch which does not require an additional gate control signal is positioned on a circuit device region including a word line driving unit, a sense amplifier, a data bus, a main amplifier, a data buffer and an input/output port. An interlayer insulating film separates a cell array region and the circuit device region, thereby reducing the whole chip size.

13 Claims, 20 Drawing Sheets

NONVOLATILE MEMORY DEVICE USING SERIAL DIODE CELL

BACKGROUND ART

1. Field of the Invention

The present invention generally relates to a nonvolatile memory device using a serial diode cell, and more specifically, to a technology of effectively arranging a cross point cell array including a nonvolatile ferroelectric capacitor and a serial diode switch to reduce the whole memory size.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of the conventional FeRAM comprises a switching device and a nonvolatile ferroelectric capacitor which is connected between one terminal of the switching device and a plate line. The switching device performs a switching operation depending on a state of a word line to connect the nonvolatile ferroelectric capacitor to a sub bit line.

Here, the switching device of the conventional FeRAM is generally a NMOS transistor whose switching operation is controlled by a gate control signal.

However, when a cell array is embodied by using the above-described NMOS transistor as a switching device, the whole chip size increases.

As a result, it is necessary to embody a cross point cell by using the above-described FeRAM having a nonvolatile characteristic and a serial diode switch which does not require a gate control signal, and to effectively arrange the cross point cell and a circuit device region for controlling the same, thereby reducing the whole chip size.

SUMMARY OF THE INVENTION

Accordingly, it is an object of the present invention to arrange a serial diode cell array on an interlayer insulating film and a circuit device region under the interlayer insulating film, thereby reducing the whole size of a nonvolatile memory device.

It is another object of the present invention to effectively arrange a pad array on the above-described serial diode cell array, thereby reducing a cell size of the nonvolatile memory device.

In an embodiment, a nonvolatile memory device using a serial diode cell comprises a plurality of serial diode cell arrays, a circuit device region and an insulating layer. Each of the plurality of serial diode cell arrays includes a plurality of unit serial diode cells arranged in row and column directions. The circuit device region, which is formed on a silicon substrate positioned under the plurality of serial diode cell arrays, drives the plurality of serial diode cell arrays. The insulating layer insulates the plurality of serial diode cell arrays from the circuit device region. Here, the unit serial diode cell comprises a nonvolatile ferroelectric capacitor and a serial diode switch. One terminal of the nonvolatile ferroelectric capacitor is connected to a word line. The serial diode switch, which is connected between the other terminal of the nonvolatile ferroelectric capacitor and a bit line, comprises two or more diode devices connected in series and a serial diode switch selectively switched depending on a voltage applied to the word line and the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
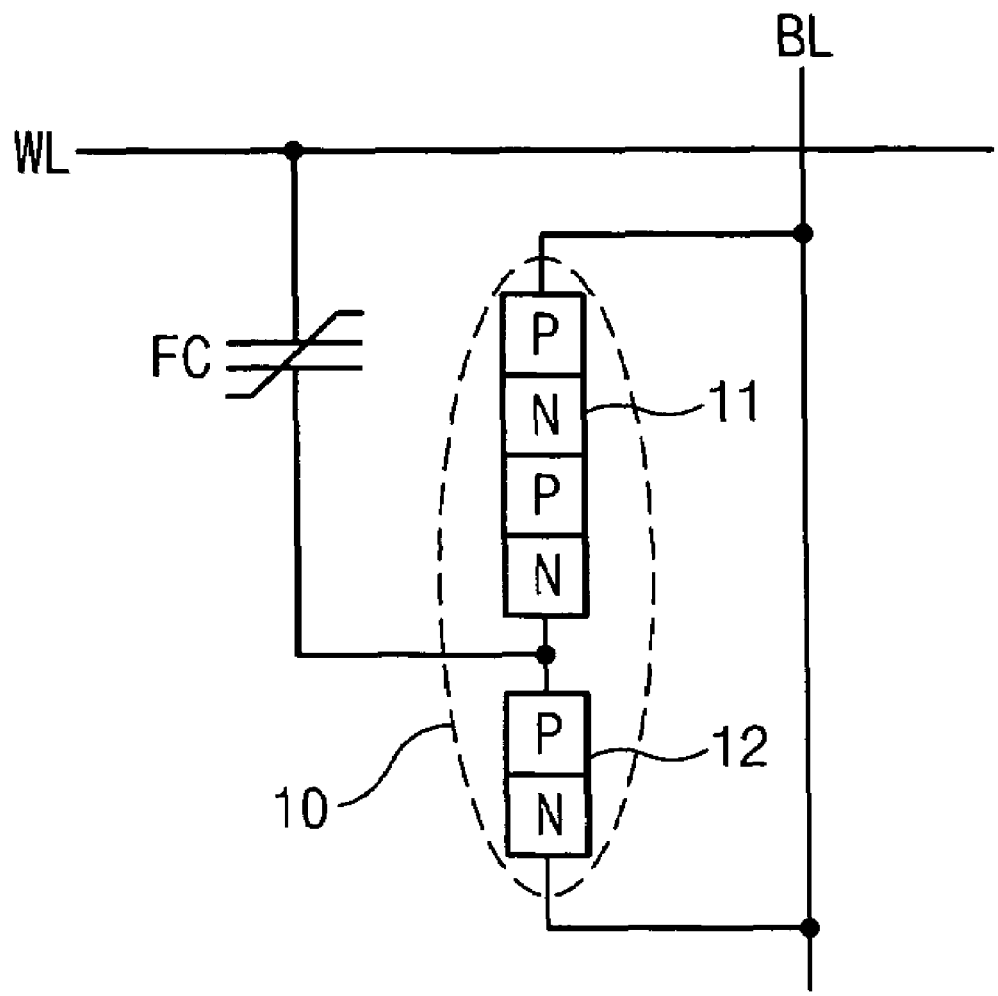
FIG. 1 is a diagram illustrating a unit serial diode cell of a nonvolatile memory device using a serial diode cell according to an embodiment of the present invention.

FIG. 1 is a diagram illustrating a unit serial diode cell of a nonvolatile memory device using a serial diode cell according to an embodiment of the present invention.

In an embodiment, a unit serial diode cell comprises a nonvolatile ferroelectric capacitor FC and a serial diode switch 10. Here, the serial diode switch 10 includes a PNPN diode switch 11 and a PN diode switch 12. The PNPN diode switch 11 and the PN diode switch 12 are connected in parallel between a bit line BL and a bottom electrode of the nonvolatile ferroelectric capacitor FC.

The PNPN diode switch 11 is connected backward between the bit line BL and one electrode of the nonvolatile ferroelectric capacitor FC, and the PN diode switch 12 is connected forward between the bit line BL and one electrode of the nonvolatile ferroelectric capacitor FC. A word line WL is connected to the other electrode of the nonvolatile ferroelectric capacitor FC.

Figure 2:
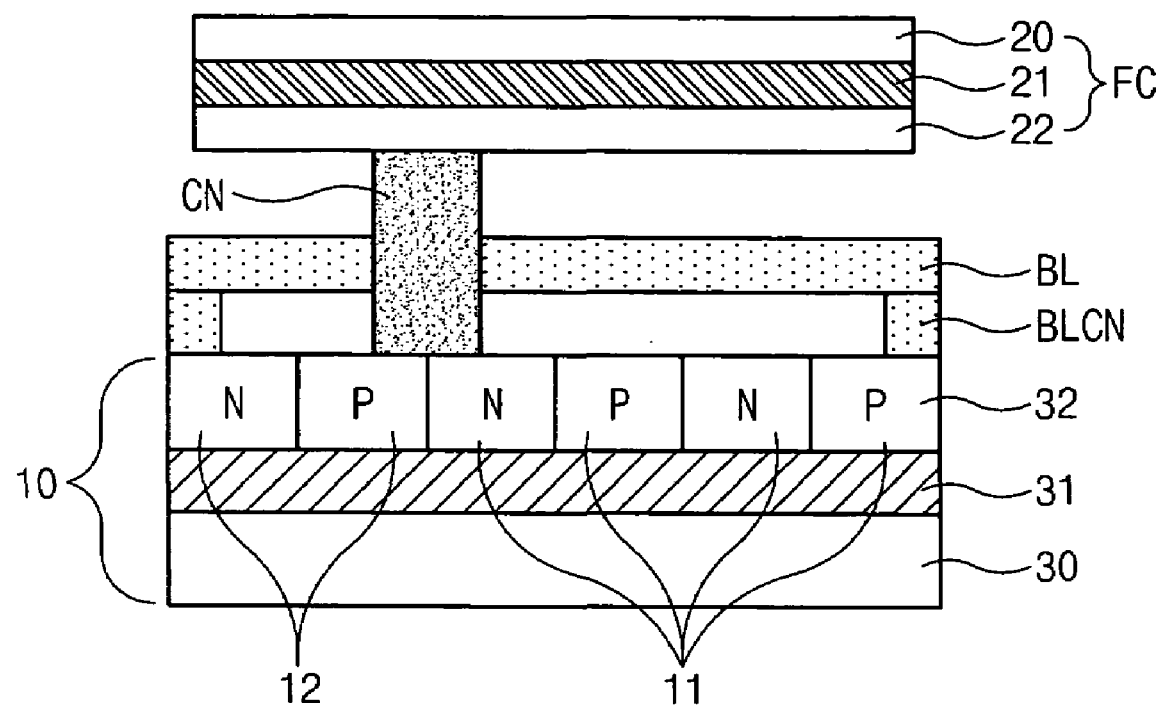
FIG. 2 is a cross-sectional diagram illustrating the serial diode cell of FIG. 1.

FIG. 2 is a cross-sectional diagram illustrating the serial diode cell of FIG. 1.

The serial diode switch 10 comprises an insulating layer 31 formed on a silicon substrate 30 and a silicon layer 32 formed on the insulating layer 31 to have a SOI (Silicon On Insulator) structure. Here, the insulating layer 31 made of $SiO_2$ is deposited on the silicon substrate 30, and the silicon layer 32 is formed on the insulating layer 31. The silicon layer 32 forms a diode chain including the PNPN diode switch 11 and the PN diode switch 12 which are connected serially. The diode switches 11,23 are made of growth silicon or polysilicon.

The PNPN diode switch 11 includes a plurality of P-type regions and N-type regions which are alternately connected in serial. The PN diode switch 12 includes a P-type region and a N-type region which are connected serially to the adjacent N-type region of the PNPN diode switch 11.

The bit line BL is formed through a bit line contact node BLCN on the N-type region of the PN diode switch 12 and the P-type region of the PNPN diode switch 11. Also, the P-type region of the PN diode switch 12 and the N-type region of the PNPN diode switch 11 are connected to a bottom electrode 22 of the nonvolatile ferroelectric capacitor FC through a common contact node CN.

Here, the nonvolatile ferroelectric capacitor FC comprises a top electrode 20, a ferroelectric layer 21 and a bottom electrode 22. The top electrode 20 of the nonvolatile ferroelectric capacitor FC is connected to the word line WL.

Figure 3:
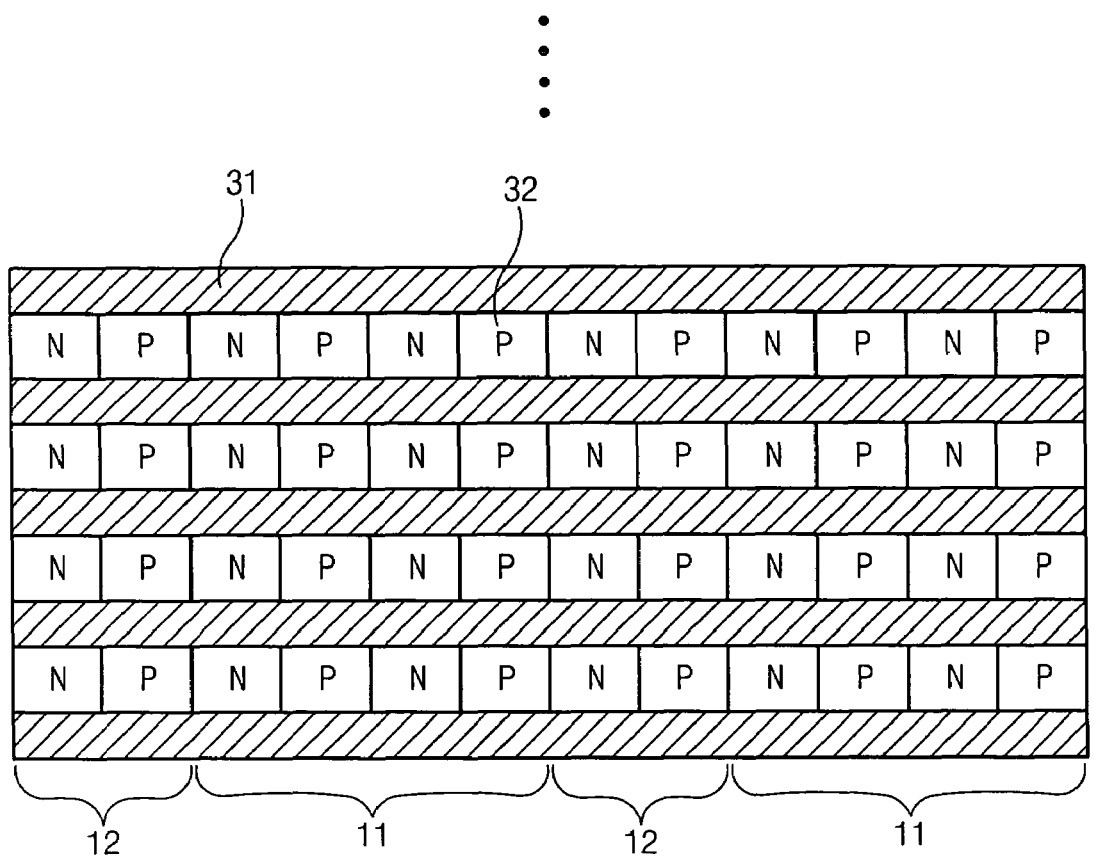
FIG. 3 is a plane diagram illustrating a serial diode switch of FIG. 1.

FIG. 3 is a plane diagram illustrating the serial diode switch 10 of FIG. 1.

The serial diode switch 10 includes the PNPN diode switch 11 and the PN diode switch 12 which are formed of the silicon layer 32 and connected in series with a serial chain type. That is, one serial diode cell comprises the PN diode switch 12 and the PNPN diode switch 11 which are connected serially. The serial diode cell adjacent to the same direction with one serial diode cell comprises the PN diode switch 12 and the PNPN diode switch 11 which are connected serially.

The serial diode switches 10 are arranged as a plurality of layers. The upper serial diode switch 10 and the lower serial diode switch 10 are separated by the insulating layer 31, respectively.

As a result, one serial diode cell region is configured by continuously selecting one PN diode switch 12 and one PNPN diode switch 11 from the serially connected diode devices.

Figure 4:
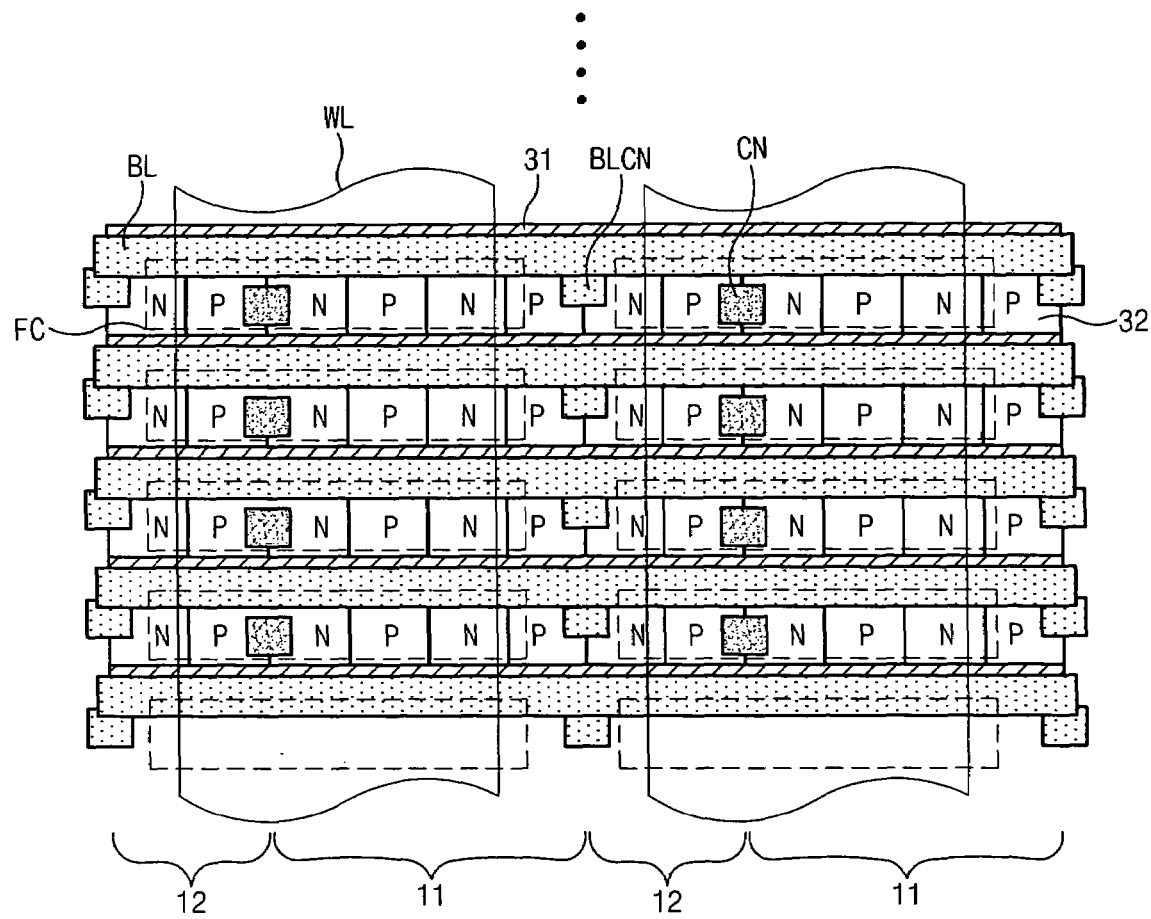
FIG. 4 is a plane diagram illustrating the serial diode cell of FIG. 1.

FIG. 4 is a plane diagram illustrating the serial diode cell of FIG. 1.

The silicon layer 32 made of growth silicon or polysilicon forms the PNPN diode switch 11 and the PN diode switch 12 which are connected serially. In each silicon layer 32, its upper portion and its lower portion are insulated through the insulating layer 31. In the serial diode switch 10, the P-type region of the PN diode switch 12 is formed adjacent to the N-type region of the PNPN diode switch 11, which are connected in common to the common contact node CN of the nonvolatile ferroelectric capacitor FC.

The N-type region of the PN diode switch 12 and the P-type region of the PNPN diode switch 11 are connected to the bit line BL through the bit line contact node BLCN. The bit line contact node BLCN is connected in common to the bit line contact node BLCN of the neighboring serial diode cell. That is, the same bit line contact node BLCN is connected in common to the P-type region of the PNPN diode switch 11 and the N-type region of the PN diode switch 12 which is adjacent to the P-type region of the PNPN diode switch 11.

The word line WL is formed on the nonvolatile ferroelectric capacitor FC.

Figure 5:
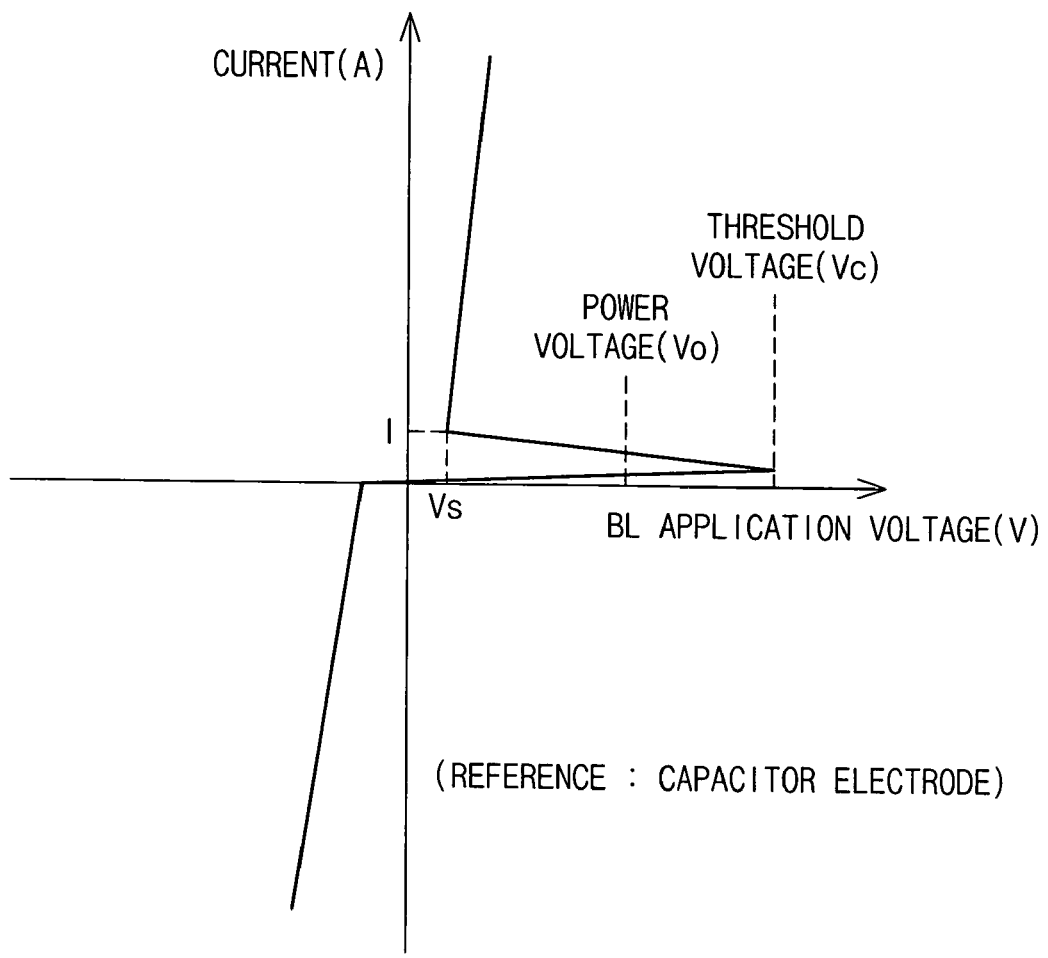
FIG. 5 is a diagram illustrating the operation of the serial diode switch of FIG. 1.

FIG. 5 is a diagram illustrating the operation of the serial diode switch 10 of FIG. 1.

When a voltage applied to the bit line BL increases in a positive direction based on the nonvolatile ferroelectric capacitor FC, the serial diode switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the serial diode switch 10 is turned on, so that current dramatically increases. Here, when the voltage applied to the bit line BL is over the threshold voltage Vc, the value of current I is caused by a value of a resistor (not shown) which serves as load connected to the bit line BL.

A large amount of current can flow even when a small voltage Vs applied to the bit line BL after the PNPN diode switch 11 is turned on. Here, the PN diode switch 10 is kept off by the backward operation characteristic.

On the other hand, if the voltage applied to the bit line BL increases in a negative direction based on the nonvolatile ferroelectric capacitor FC, that is, when a predetermined voltage is applied to the word line WL, the serial diode switch 10 is turned on by the forward operation characteristic of the PN diode switch 12, so that current flows in a random operating voltage. Here, the PNPN diode switch 11 is kept off by the backward operation characteristic.

Figure 6A:
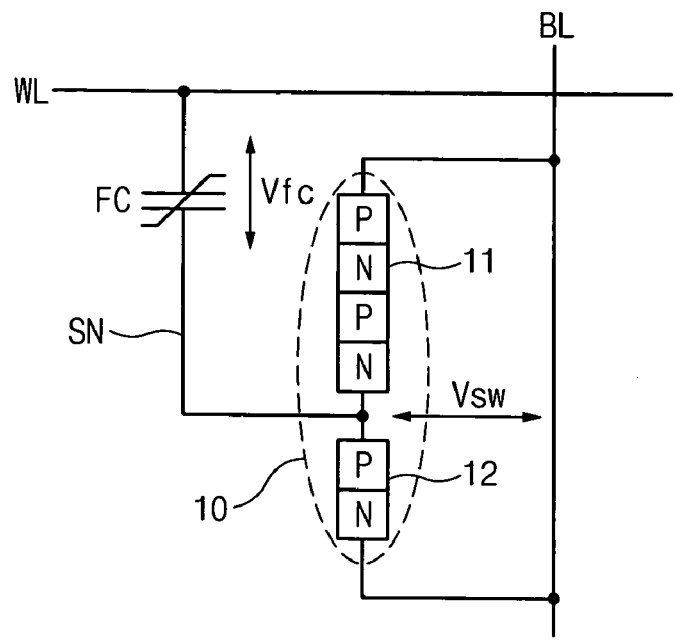
FIGS. 6a to 6c are diagrams illustrating dependency of voltages of a word line and a bit line in the serial diode cell of FIG. 1.
Figure 6B:
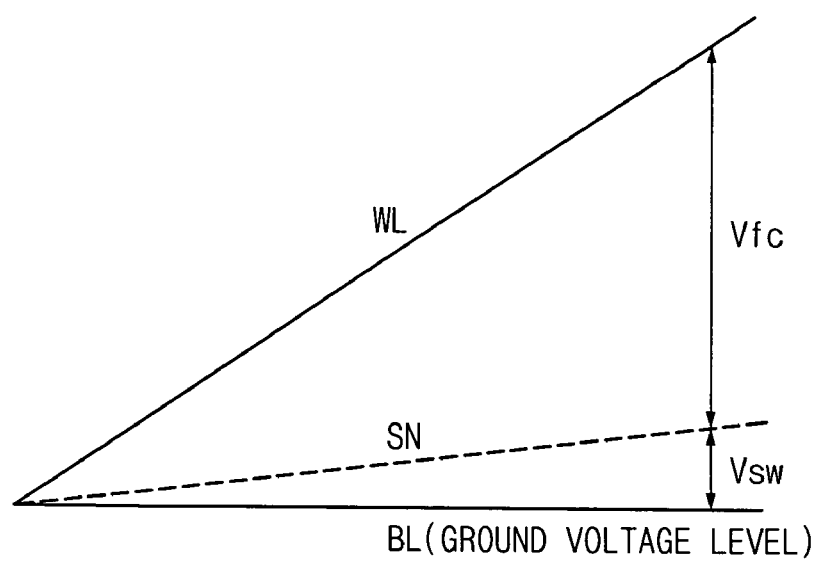
Figure 6C:
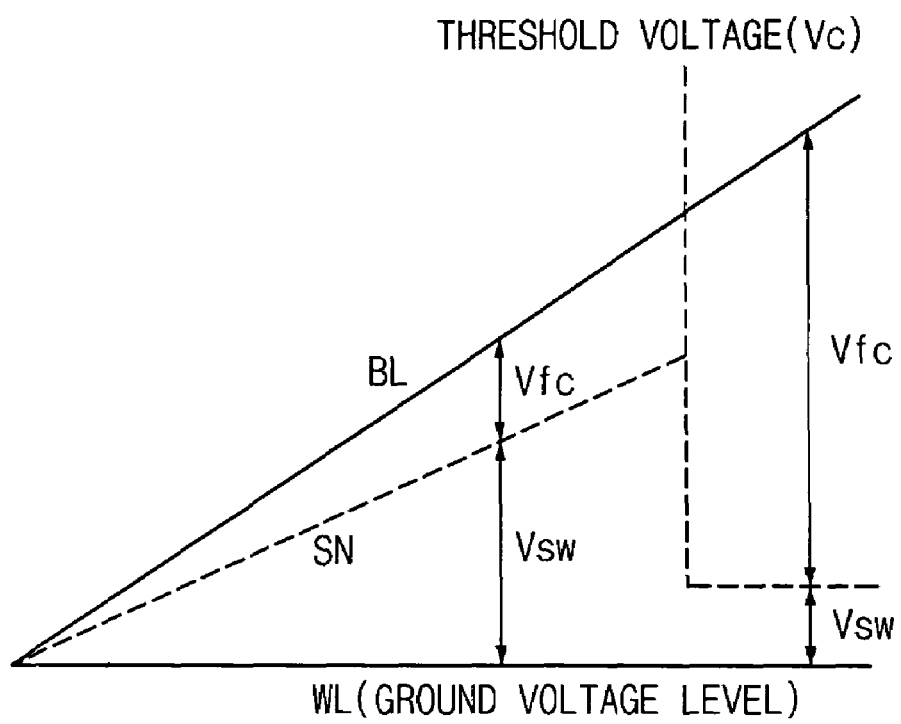

FIGS. 6a to 6c are diagrams illustrating dependency of voltages of a word line and a bit line in the serial diode cell of FIG. 1.

Referring to FIG. 6a, a voltage flowing in the nonvolatile ferroelectric capacitor FC connected between the word line WL and a node SN refers to a voltage Vfc, and a voltage flowing in the serial diode switch 10 connected between the node SN and the bit line BL refers to a voltage Vsw.

FIG. 6b is a diagram illustrating the voltage dependency of the word line WL in the serial diode cell according to an embodiment of the present invention.

When a voltage of the word line WL increases while a voltage of the bit line BL is fixed at a ground voltage level, the voltage of the word line WL is distributed in the nonvolatile ferroelectric capacitor FC and the serial diode switch 10.

That is, when the voltage of the word line WL increases while the voltage of the bit line BL is at the ground level, the PN diode switch 12 of the serial diode switch 10 is turned on in a small voltage, so that current flows.

Here, the small voltage Vsw is distributed to the serial diode switch 10 by the forward operation characteristic of the PN diode switch 12. On the other hand, the large voltage Vfc of the word line WL voltage is distributed to the nonvolatile ferroelectric capacitor FC, thereby improving the operation characteristic.

FIG. 6c is a diagram illustrating the voltage dependency of the bit line BL in the serial diode cell according to an embodiment of the present invention.

When the voltage of the bit line BL increases while the voltage of the word line WL is fixed at the ground voltage level, the voltage of the bit line BL is distributed in the nonvolatile ferroelectric capacitor FC and the serial diode switch 10.

That is, when the voltage of the bit line BL increases while the voltage of the word line WL is at the ground level, the PNPN diode switch 11 of the serial diode switch 10 is kept off before the voltage of the bit line BL reaches the threshold voltage Vc. The PN diode switch 12 of the serial diode switch 10 is kept off by its backward operation characteristic. As a result, the large voltage Vsw of the bit line BL voltage is distributed to the serial diode switch 10.

On the other hand, when the serial diode switch 10 is at a turn-off state, the small voltage Vfc of the bit line BL voltage is distributed to the nonvolatile ferroelectric capacitor FC. As a result, data stored in the nonvolatile ferroelectric capacitor Fc is not changed, so that the operation is kept at a stationary state.

Thereafter, when the voltage of the bit line BL rises to be over the threshold voltage Vc, the PNPN diode switch 11 of the serial diode switch 10 is turned on. As a result, the voltage Vfc of the bit line BL voltage is distributed to the nonvolatile ferroelectric capacitor FC, so that new data can be written in the nonvolatile ferroelectric capacitor FC.

Figure 7:
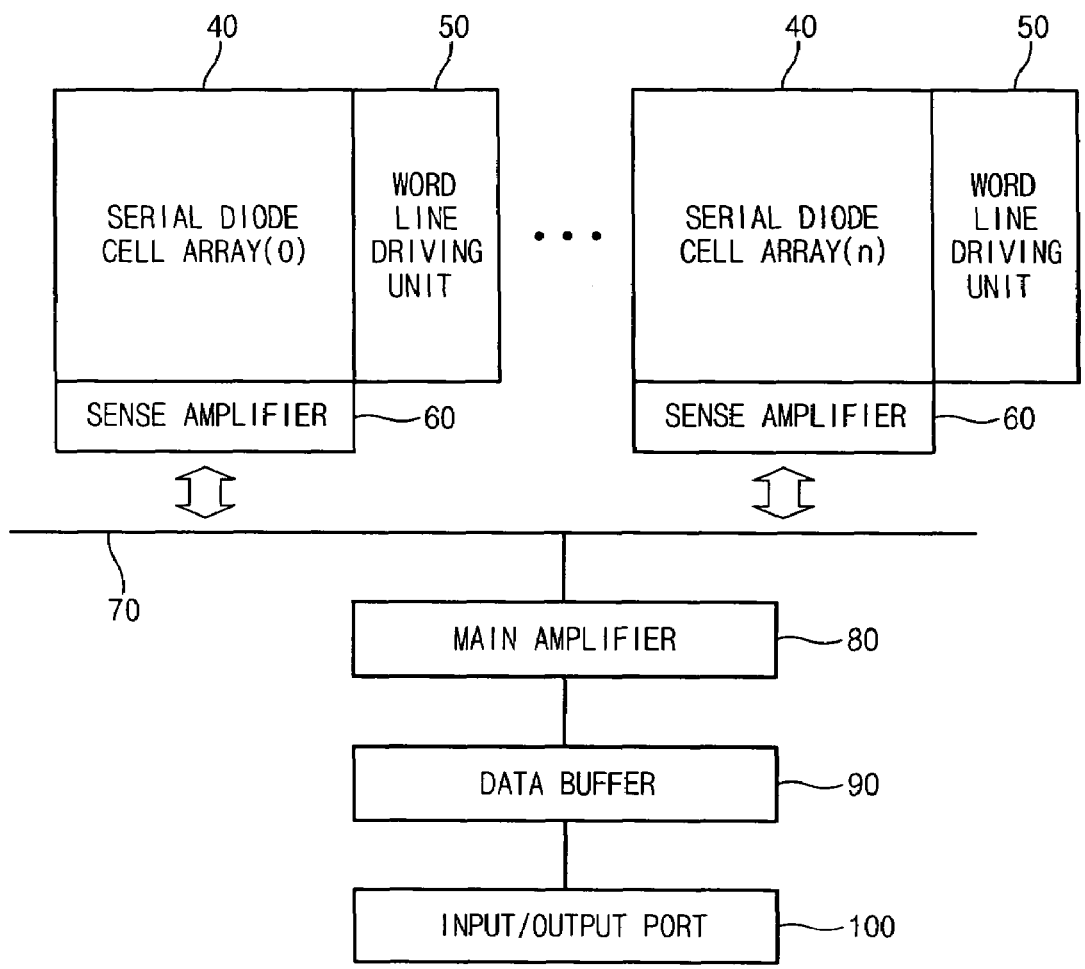
FIG. 7 is a diagram illustrating a nonvolatile memory device using a serial diode cell according to an embodiment of the present invention.

FIG. 7 is a diagram illustrating a nonvolatile memory device using a serial diode cell according to an embodiment of the present invention.

In an embodiment, the nonvolatile memory device comprises a plurality of serial diode cell arrays 40, a plurality of word line driving units 50, a plurality of sense amplifiers 60, a data bus 70, a main amplifier 80, a data buffer 90 and an input/output port 100.

In each serial diode cell array 40, a plurality of serial diode cells shown in FIG. 1 are arranged in row and column directions. A plurality of word lines WL arranged in the row direction are connected to the word line driving unit 50. A plurality of bit lines BL arranged in the column direction are connected to the sense amplifier 60.

Here, one serial diode cell array 40 is correspondingly connected to one word line driving unit 50 and one sense amplifier 60.

A plurality of sense amplifiers 60 share one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 externally outputs output data applied from the data buffer 90, and applies externally applied input data to the data buffer 90.

Figure 8:
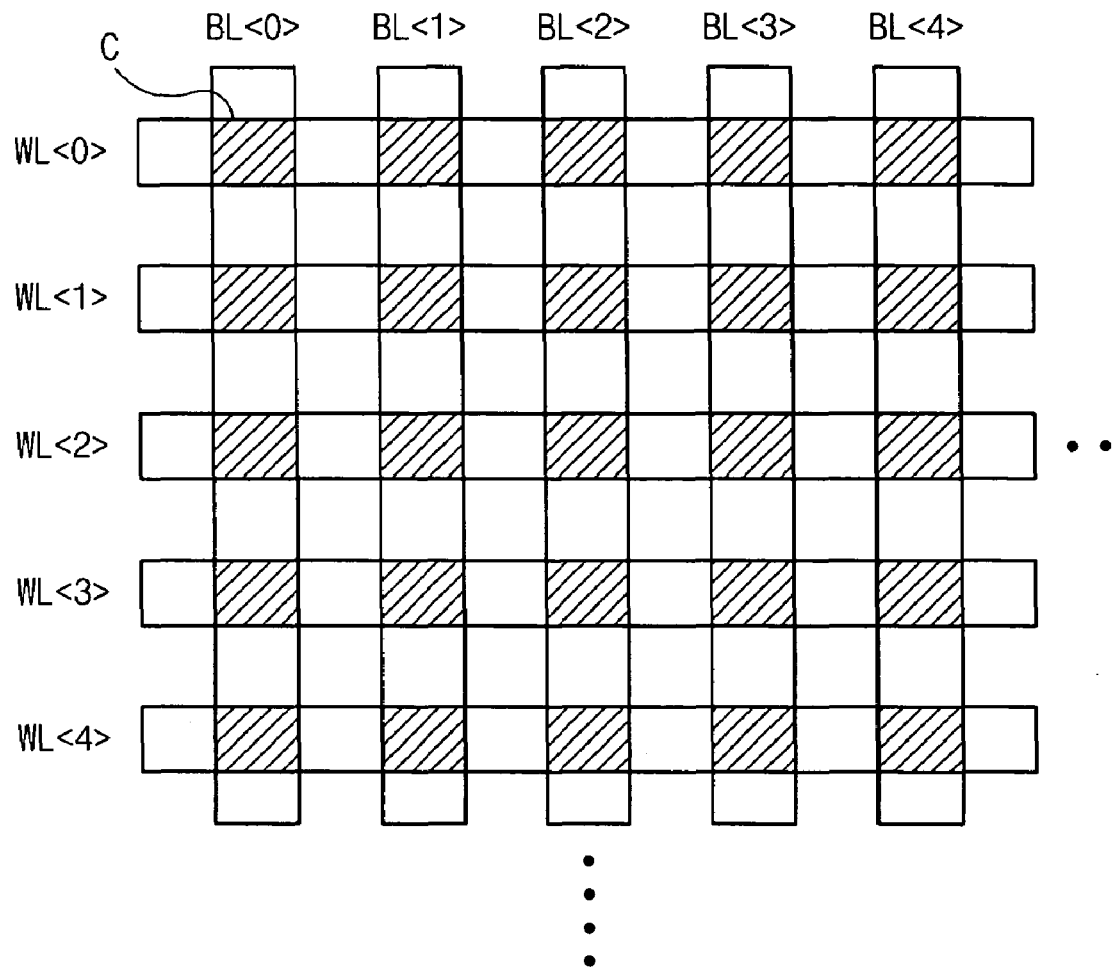
FIG. 8 is a layout diagram illustrating a serial diode cell array of FIG. 7.

FIG. 8 is a layout diagram illustrating the serial diode cell array 40 of FIG. 7.

The serial diode cell array 40 includes a plurality of word lines WL arranged in a row direction and a plurality of bit lines BL arranged in a column direction. Since a unit cell C is positioned where the word line WL and the bit line are crossed, a cross point cell which does not require an additional area can be embodied.

Here, the cross point cell does not comprise a NMOS transistor which uses an additional word line WL gate control signal. The cross point cell refers to a structure where the nonvolatile ferroelectric capacitor FC is located at a cross point of the bit line BL and the word line WL with the serial diode switch 10 comprising two electrode nodes.

Figure 9:
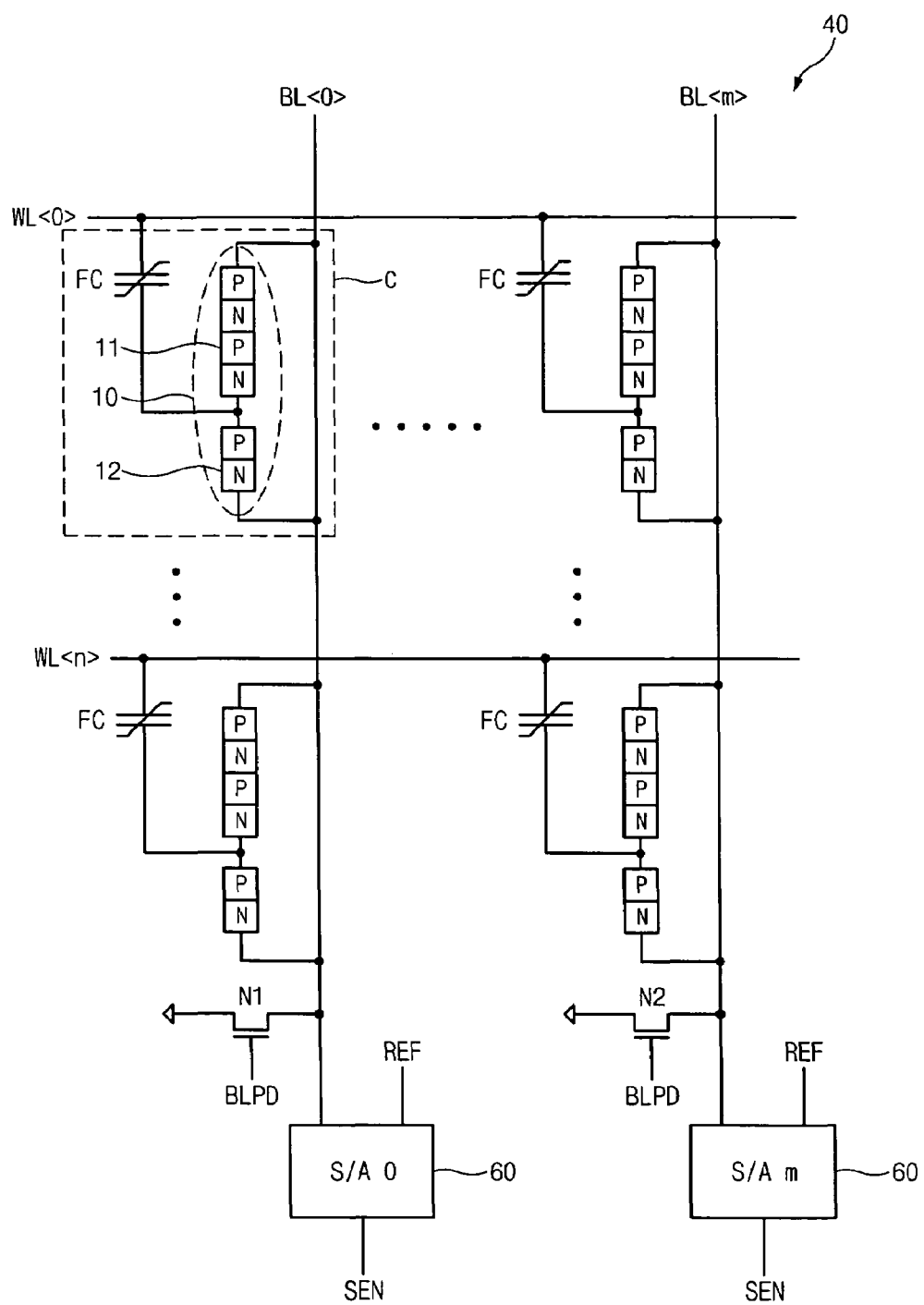
FIG. 9 is a circuit diagram illustrating the serial diode cell array of FIG. 7.

FIG. 9 is a circuit diagram illustrating the serial diode cell array 40 of FIG. 7.

The serial diode cell array 40 comprises a plurality of word lines WL<0>~WL<n> each arranged in the row direction and a plurality of bit lines BL<0>~BL<m> each arranged in the column direction. A unit cell C is located only in a region where the word line WL and the bit line BL are crossed. Here, one unit cell C comprises the nonvolatile ferroelectric capacitor FC and the serial diode witch 10.

The plurality of sense amplifiers 60 are connected one by one to the plurality of bit lines BL<0>~BL<m>. When a sense amplifier enable signal SEN is activated, each sense amplifier 60 compares a previously set reference voltage REF with a voltage applied from the bit line BL and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL to pull down the bit line BL to the ground level.

The above-described serial diode cell array 40 is configured so that each of the nonvolatile ferroelectric capacitors FC can store one data.

Figure 10:
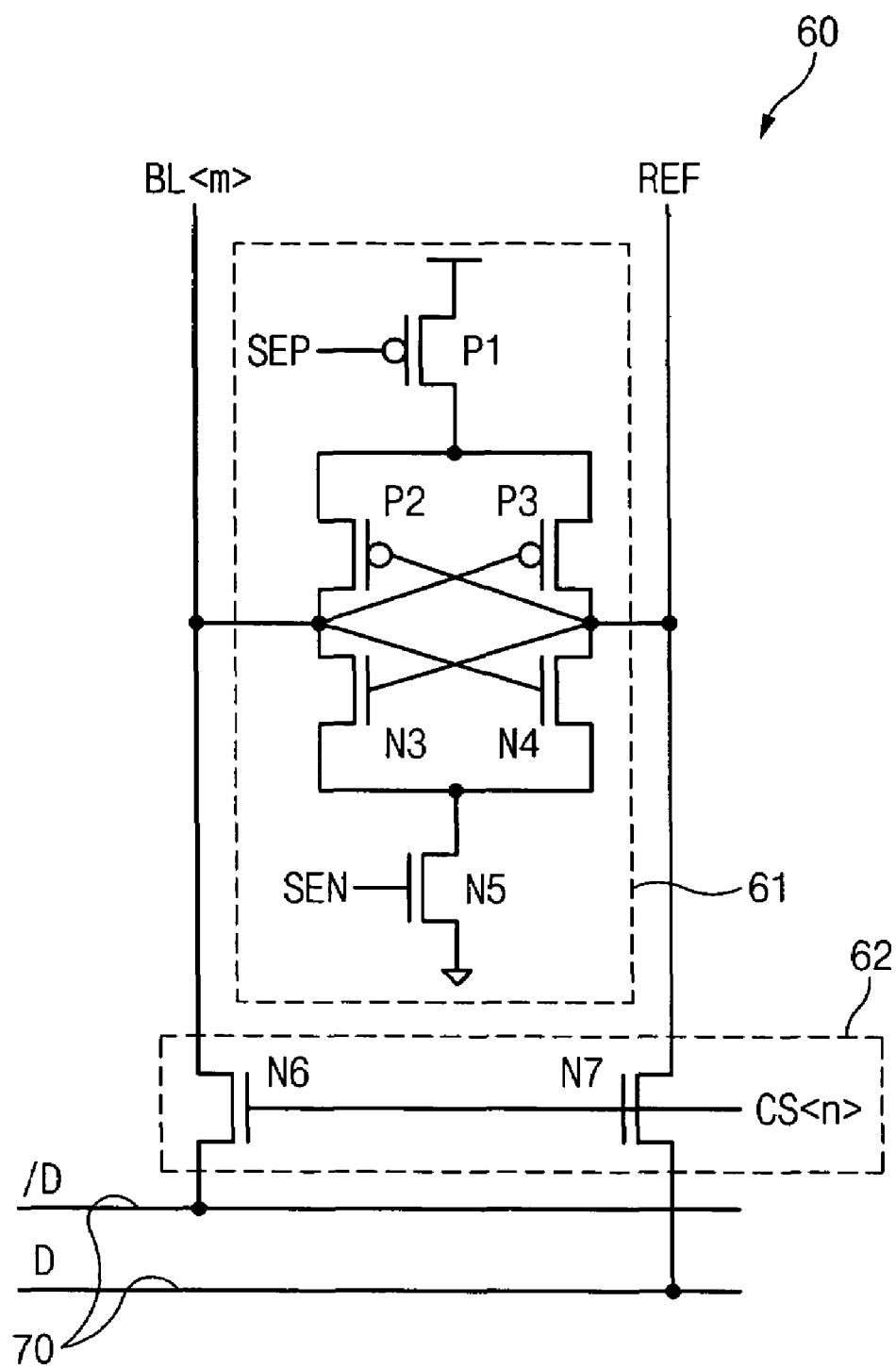
FIG. 10 is a circuit diagram illustrating a sense amplifier of FIG. 9.

FIG. 10 is a circuit diagram illustrating the sense amplifier 60 of FIG. 9.

The sense amplifier 60 comprises an amplification unit 61 and a column selection switching unit 62.

Here, the amplification unit 61 comprises PMOS transistors P1~P3 and NMOS transistors N1~N3. The PMOS transistor P1, connected between a power voltage terminal and a common source of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N5, connected between a ground voltage terminal and a common source of NMOS transistors N3 and N4, has a gate to receive the sense amplifier enable signal SEN. The cross-coupled NMOS transistors N3 and N4 latch the ground voltage applied through the NMOS transistor N5.

Here, the sense amplifier enable signal SEN has an opposite phase to that of the sense amplifier enable signal SEP. When the sense amplifier enable signal SEN is activated, the amplification unit 61 is operated. One output terminal of the amplification unit 61 is connected to the bit line BL<m>, and the other output terminal of the amplification unit 61 is connected to a terminal to receive the reference voltage REF.

The column selection switching unit 62 comprises NMOS transistors N6 and N7. The NMOS transistor N6, connected between the bit line BL<m> and the data bus 70, controls input/output operations of data /D in response to a column selecting signal CS<n> applied through its gate. The NMOS transistor N7, connected between the data bus 70 and the terminal to receive the reference voltage REF, controls input/output operations of data D in response to the column selecting signal CS<n> applied through its gate.

Figure 11:
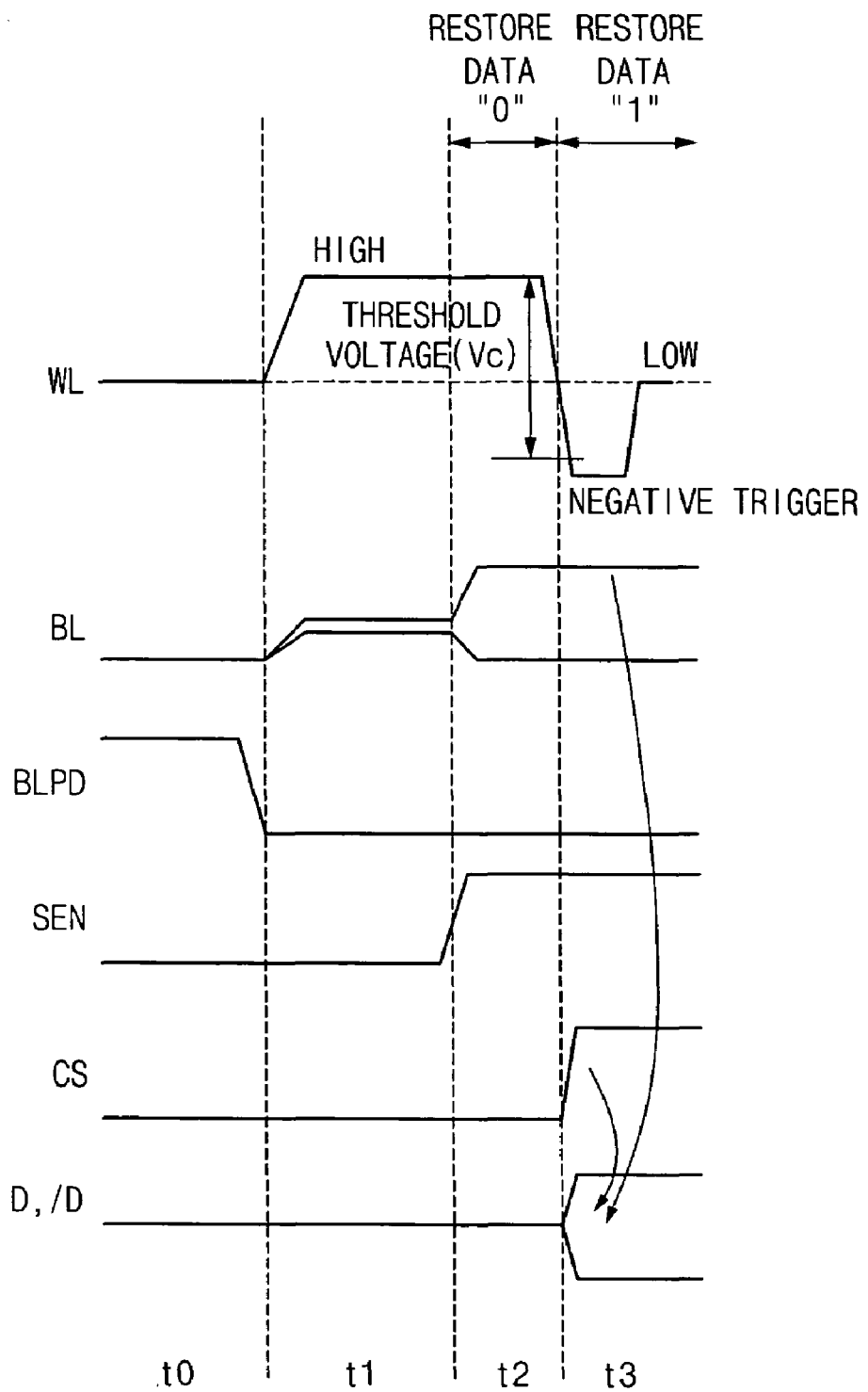
FIG. 11 is a timing diagram illustrating a read operation of a nonvolatile memory device using a serial diode cell according to an embodiment of the present invention.

FIG. 11 is a timing diagram illustrating a read operation of a nonvolatile memory device using a serial diode cell according to an embodiment of the present invention.

In a period t0, a bit line pull-down signal BLPD is activated to apply the ground voltage to a pair of the bit lines BL, so that the bit line BL is precharged to the ground level.

Thereafter, when a period t1 starts, if the word line WL transits to 'high' and a predetermined voltage is applied to the word line WL, the PN diode switch 12 of the serial diode switch 10 is turned on. As a result, data of the serial diode cell is transmitted to the bit line BL. Here, the bit line pull-down signal BLPD transits to 'low'.

In a period t2, the sense amplifier enable signal SEN is activated to amplify data in the bit line BL. If the voltage of the bit line BL is amplified to a low level when a voltage of the word line WL is at a high level, data "0" is restored in the serial diode cell C.

Thereafter, in a period t3, the voltage of the word line WL transits to a negative voltage which is a value below the threshold voltage Vc. That is, a difference between the low voltage level of the bit line BL and the negative voltage level of the word line WL does not reach the state of the threshold voltage Vc to turn on the PNPN diode switch 11 of the serial diode switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on to restore data "1" in the serial diode cell.

After the PNPN diode switch 11 is turned on, as shown in FIG. 5, a large amount of current can flow although a small voltage Vs is applied to the bit line BL. As a result, in the period t3, although the voltage of the word line WL rises from the negative voltage to the low level, current can flow sufficiently.

In the period t3, if a column selecting signal CS transits to 'high', the NMOS transistors N6 and N7 of the column selection switching unit 62 are turned on. Then, the data D and /D in the bit line BL are outputted to the data bus 70, so that data stored in the serial diode cell C can be read.

Figure 12:
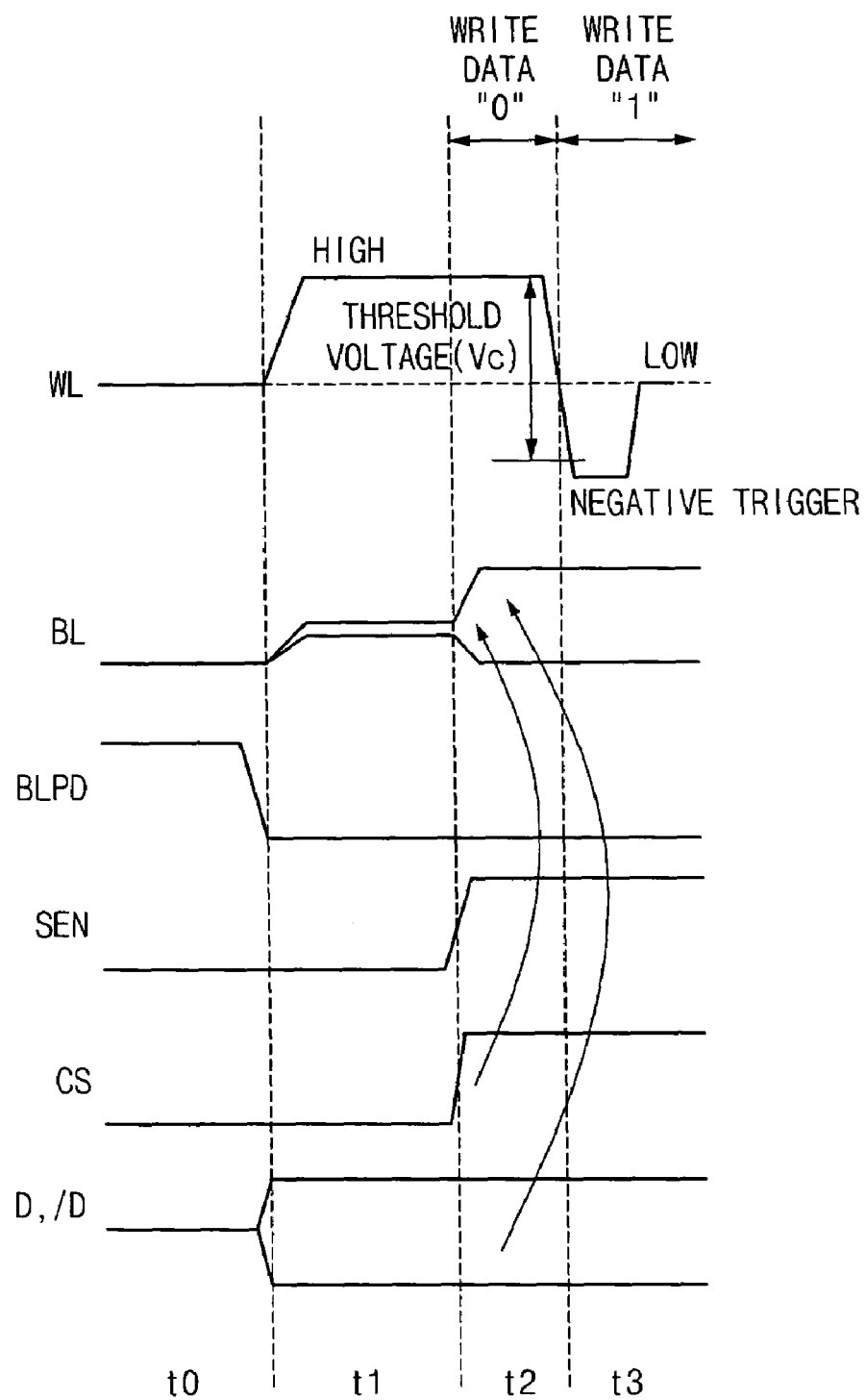
FIG. 12 is a timing diagram illustrating a write operation of a nonvolatile memory device using a serial diode cell according to an embodiment of the present invention.

FIG. 12 is a timing diagram illustrating a write operation of a nonvolatile memory device using a serial diode cell according to an embodiment of the present invention.

In a period t0, the bit line pull-down signal BLPD is activated to apply the ground voltage to the pair of bit lines BL, so that the bit line BL is precharged to the ground level.

Thereafter, when a period t1 starts, if the word line WL transits to 'high', data of the serial diode cell are transmitted to the bit line BL. Here, the bit line pull-down signal BLPD transits to 'low'. Then, new data D and /D to be written through the data bus 70 are inputted in the bit line BL.

In a period t2, the sense amplifier enable signal SEN is activated to amplify data in the bit line BL. If the voltage of the bit line BL is amplified to the low level while the voltage of the word line WL is at the high level, data "0" is written in the serial diode cell C.

Here, if the column selecting signal CS transits to 'high', the NMOS transistors N6 and N7 of the column selection switching unit 62 are turned on, so that the data D and /D inputted through the data bus 70 are applied to the bit line BL.

Thereafter, in a period t3, the voltage of the word line WL transits to the negative voltage. That is, a difference between the low voltage level of the bit line BL and the negative voltage level of the word line WL does not reach the state of the threshold voltage Vc to turn on the PNPN diode switch 11 of the serial diode switch 10.

However, a voltage over the threshold voltage Vc to turn on the PNPN diode switch 11 is applied depending on the difference between the high amplification voltage of the bit line BL and the negative voltage of the word line WL. As a result, the PNPN diode switch 11 is turned on, so that data "1" is written in the serial diode cell.

Although a nonvolatile ferroelectric memory device is exemplified as a memory device for storing data herein, the memory device according to an embodiment of the present invention can include a DRAM device or a flash device.

Figure 13:
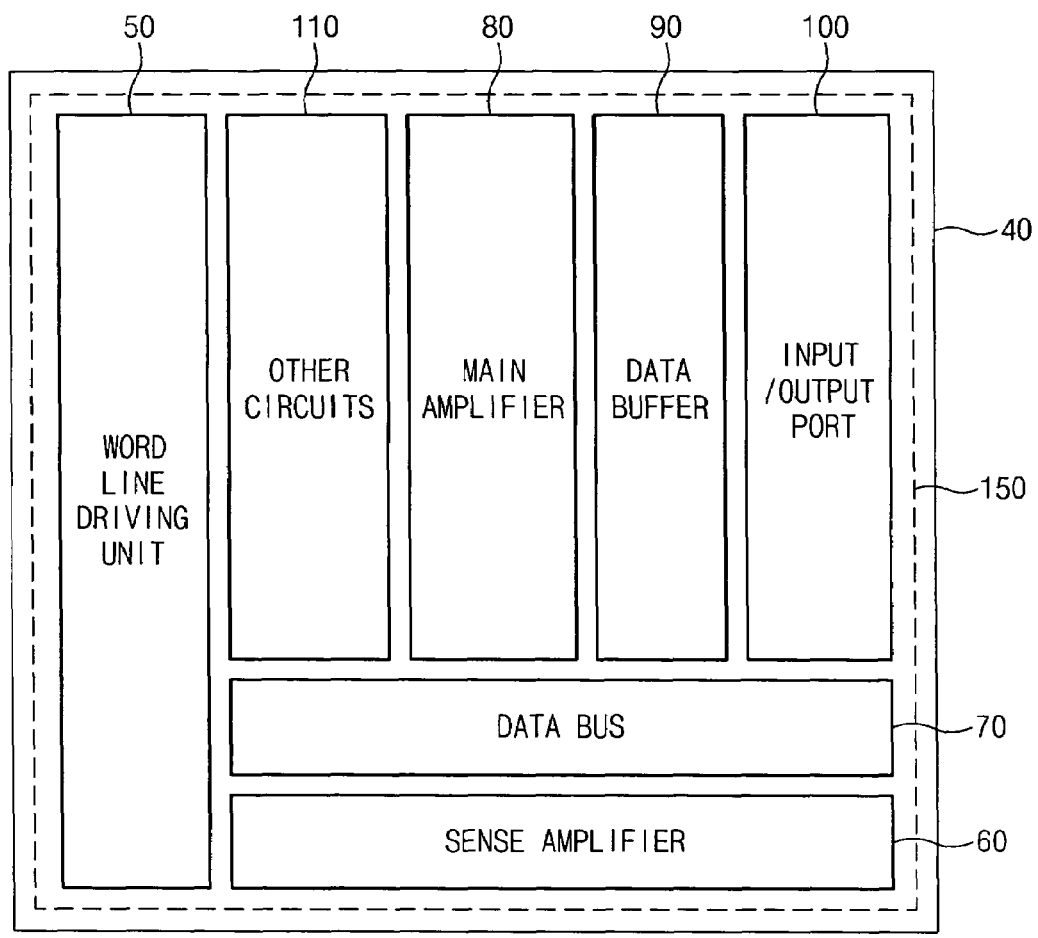
FIG. 13 is a plane diagram illustrating a nonvolatile memory device using a serial diode cell according to an embodiment of the present invention.

FIG. 13 is a plane diagram illustrating a nonvolatile memory device using a serial diode cell according to an embodiment of the present invention.

Based on the insulating layer 31, the serial diode cell array 40 is arranged on its upper portion, and a circuit device region 150 including the word line driving unit 50 for driving the serial diode cell array 40, the sense amplifier 60 for driving the bit line, the data bus 70, a main amplifier 80, a data buffer 90, an input/output port 100 and other circuits 110 is arranged on its lower portion.

Here, the circuit device region 150 is formed on the silicon substrate 30, and the serial diode cell array 40 is formed on the silicon layer 32 made of polysilicon or growth silicon. The serial diode cell array 40 and the circuit device region 150 are separated through the insulating layer 31.

As a result, the serial diode cell array 40 and the circuit device region 150 are arranged in different layers based on the insulating layer 31, thereby reducing the cell size without requiring an additional expansion region.

Figure 14:
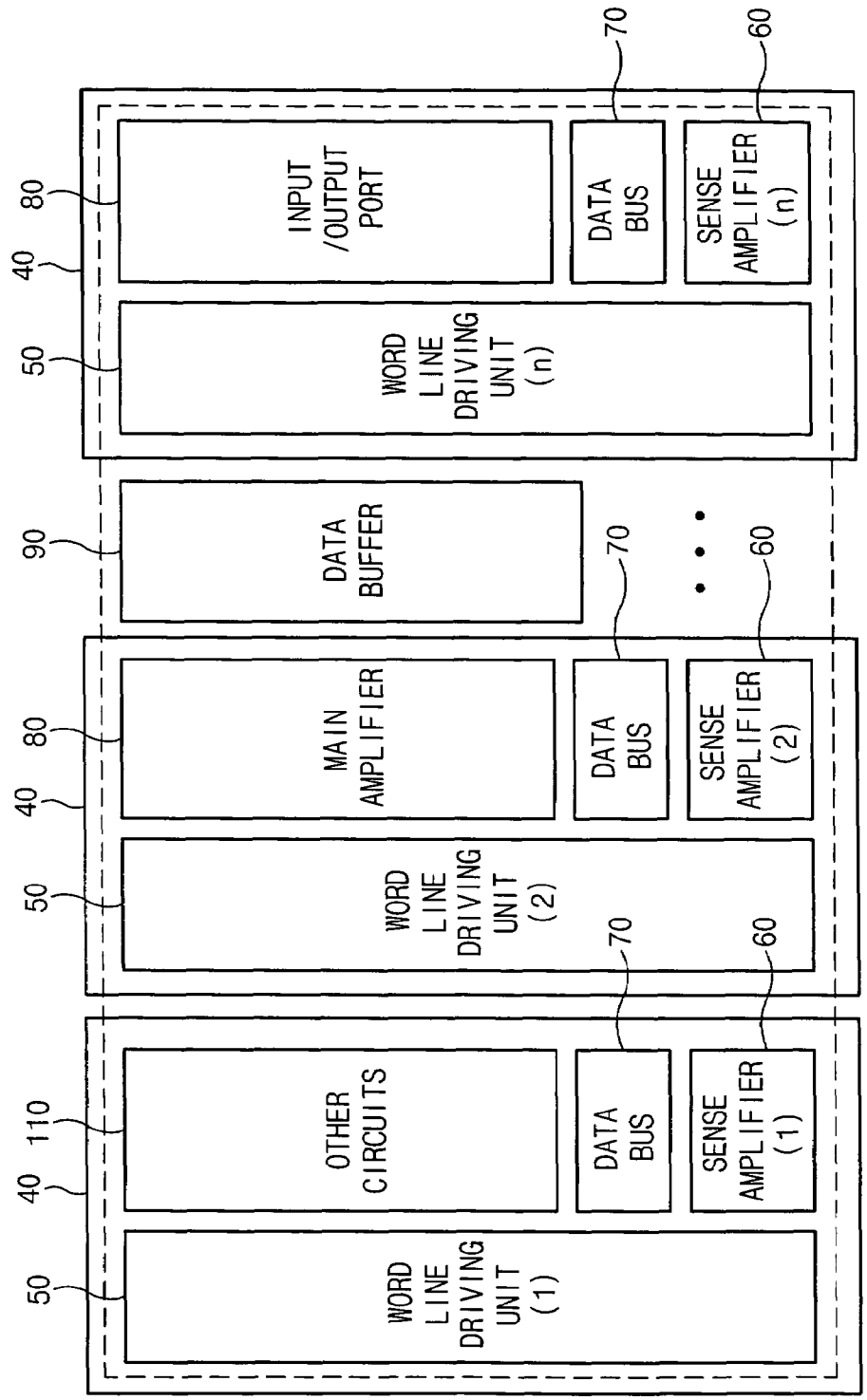
FIG. 14 is a diagram illustrating a nonvolatile memory device using a serial diode cell according to another embodiment of the present invention.

FIG. 14 is a diagram illustrating a nonvolatile memory device using a serial diode cell according to another embodiment of the present invention.

In the embodiment of FIG. 14, the serial diode cell array 40 region is divided into a plurality of cell array blocks. Each cell array block includes the word line driving unit 50 for driving a cell array, the sense amplifier 60 and the data bus 70. The main amplifier 80, the data buffer 90, the input/output port 100 and other circuits 110 are distributed in different cell array blocks.

Figure 15:
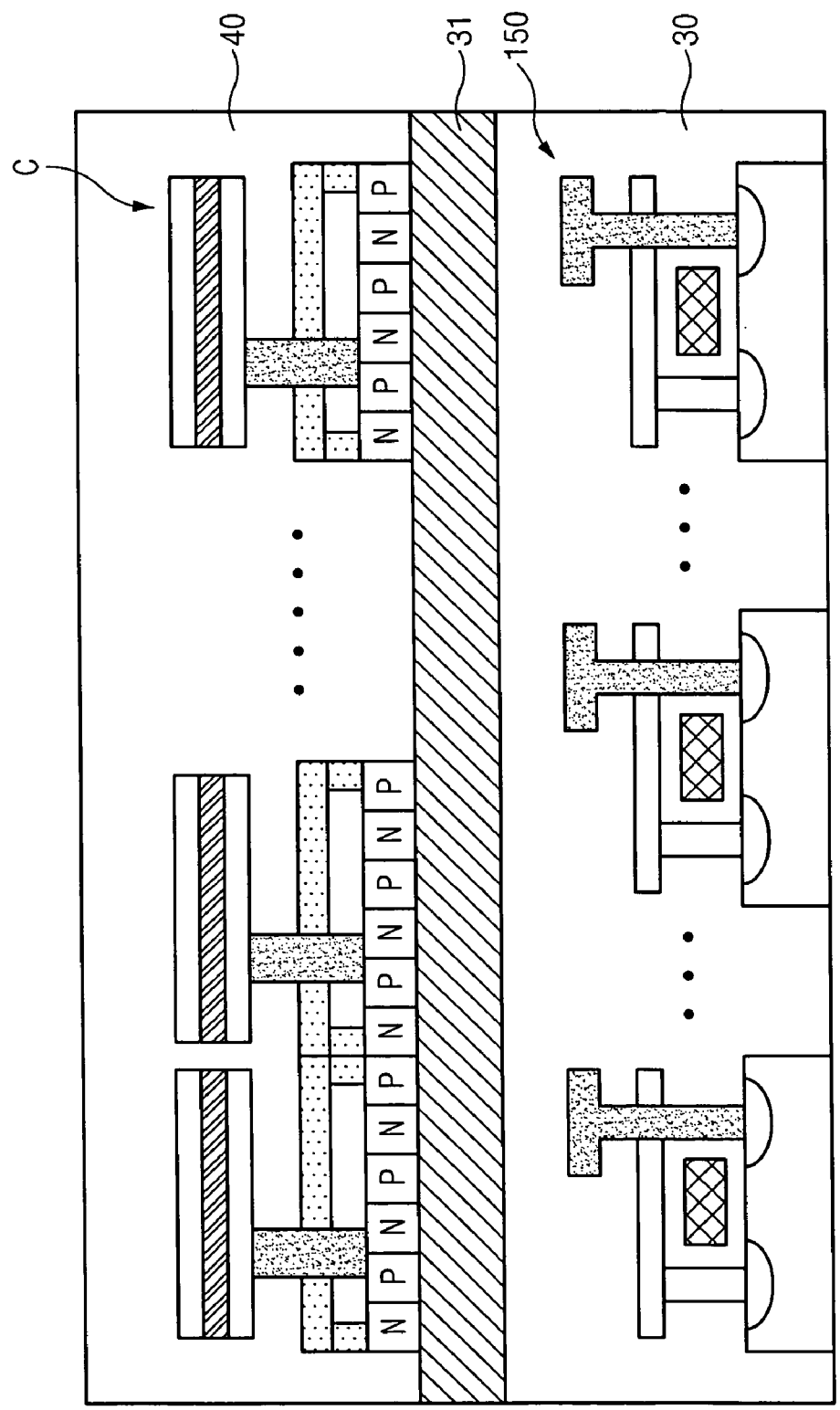
FIG. 15 is a cross-sectional diagram illustrating a nonvolatile memory device according to an embodiment of the present invention.

FIG. 15 is a cross-sectional diagram illustrating a nonvolatile memory device according to an embodiment of the present invention.

Based on the insulating layer 31, the serial diode cell array 40 is located on its upper portion. Here, the serial diode cell array 40 comprises a plurality of unit cells C connected serially. The unit cell C comprises the serial diode switch 10 including the PN diode switch 12 and the PNPN diode switch 11, the word line WL, the bit line BL and the nonvolatile ferroelectric capacitor FC.

Based on the insulating layer 31, a plurality of circuit device regions 150 for driving the serial diode cell array 40 are arranged on the silicon substrate 30 of the lower portion.

Figure 16:
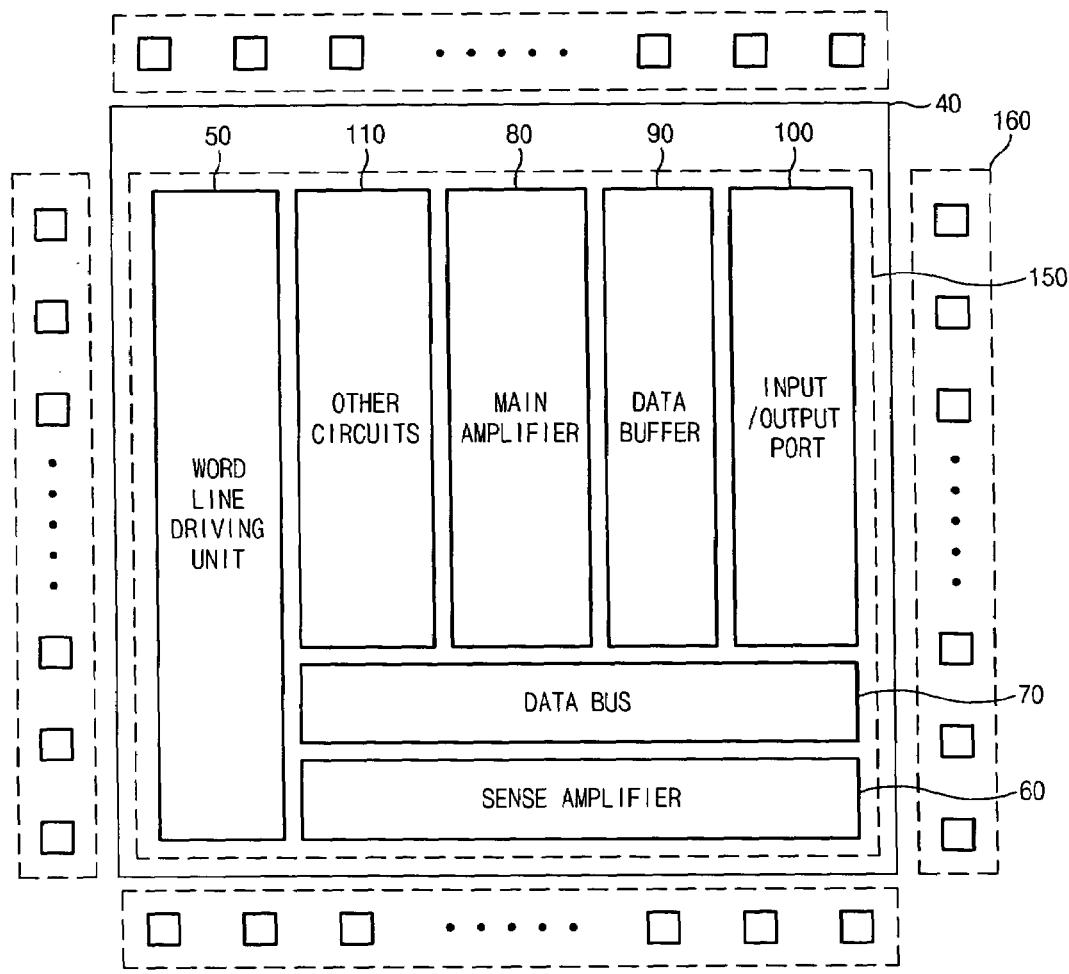
FIG. 16 is a plane diagram illustrating a pad array according to a first embodiment of the present invention.

FIG. 16 is a plane diagram illustrating a pad array 160 according to a first embodiment of the present invention.

The pad array 160 of FIG. 16, which comprises an address pin and a data pin, exchanges data read/written from the serial diode cell array 40. The pad array 160 is arranged in an external region apart from the serial diode cell array 40 and the circuit device region 150.

A metal layer required in the pad array 160 is configured to be connected to a metal layer used in the circuit device region 150, so that the metal layers may be used at the same time. As a result, a space for forming an additional pad array 160 is not required, thereby reducing mask layers.

Figure 17:
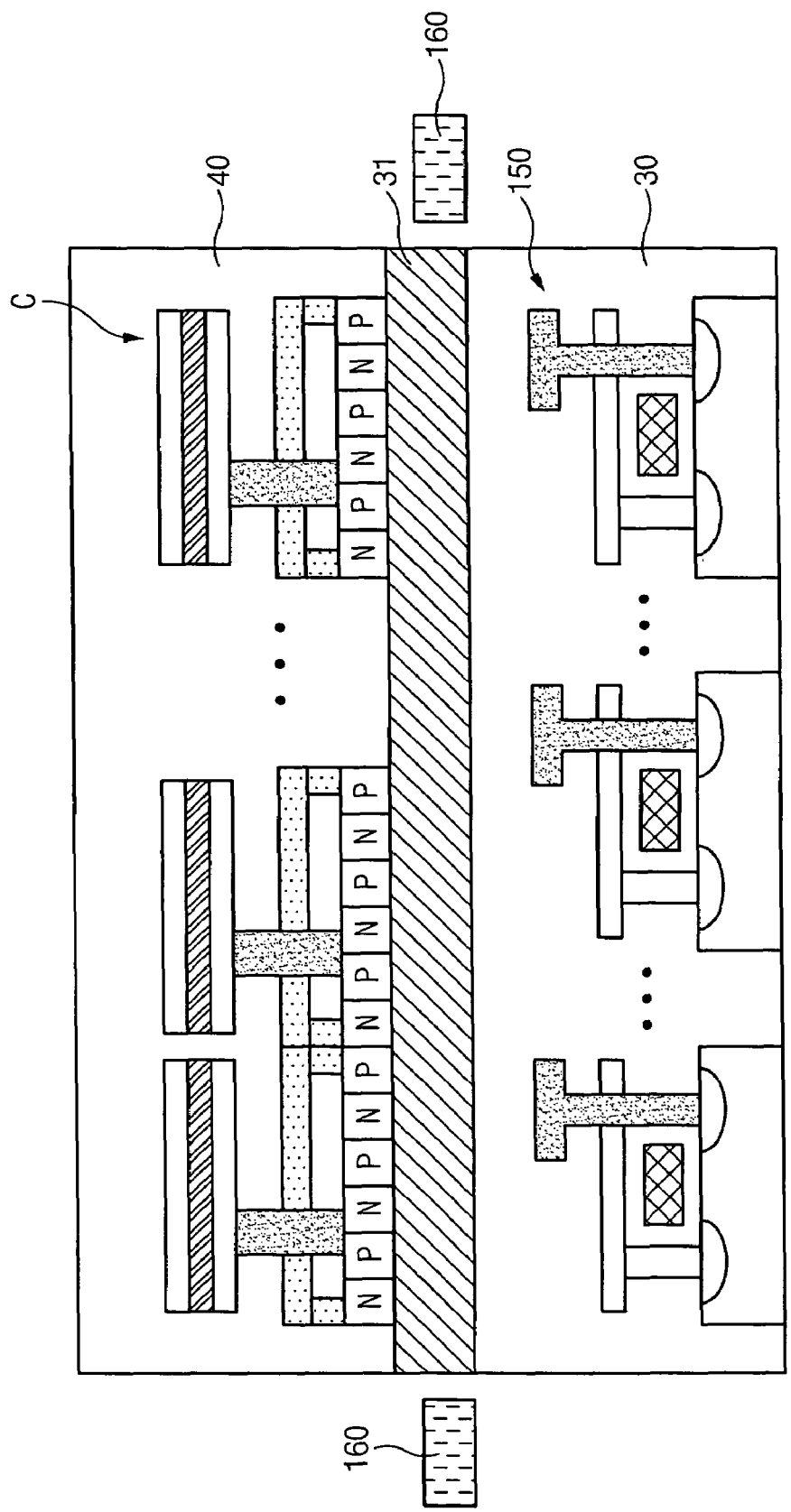
FIG. 17 is a cross-sectional diagram illustrating the pad array of FIG. 16.

FIG. 17 is a cross-sectional diagram illustrating the pad array 160 of FIG. 16.

Referring to FIG. 17, the pad array 160 is formed under the serial diode cell array 40, and is positioned at the same location as that of the insulating layer 31. The pad array 160 connected to the circuit device region 150 uses the same metal layer.

Figure 18:
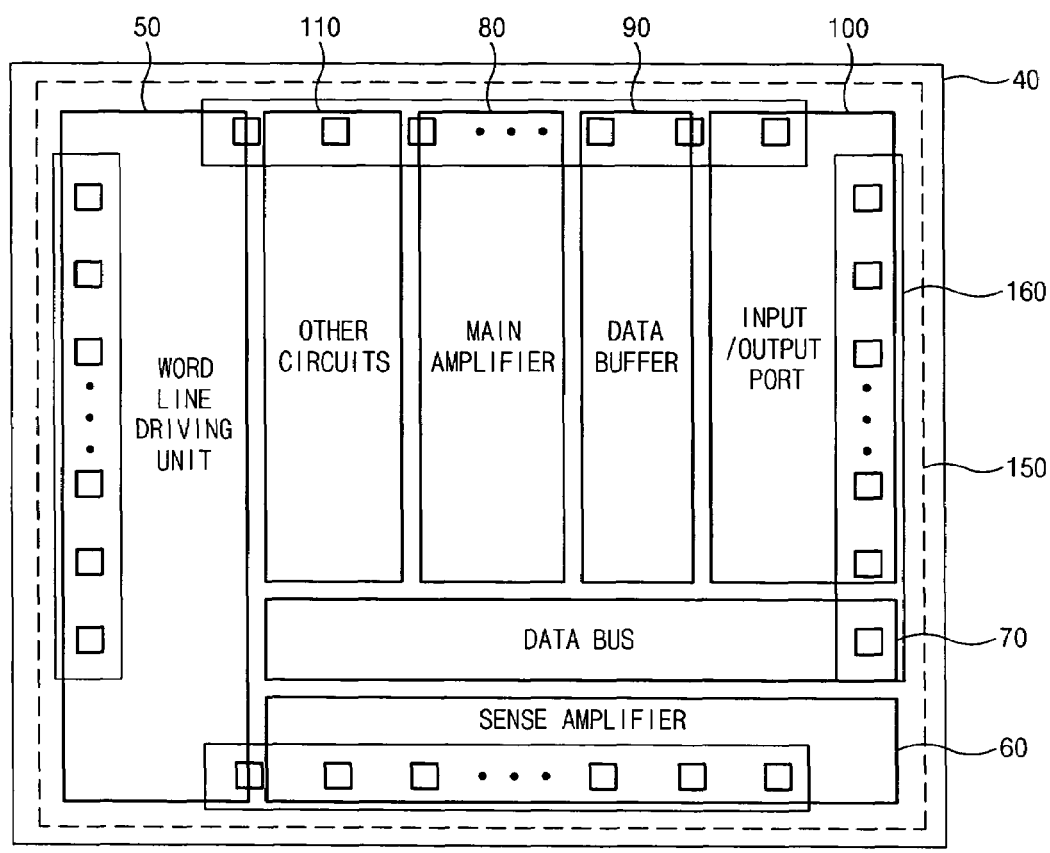
FIG. 18 is a plane diagram illustrating a pad array according to a second embodiment of the present invention.

FIG. 18 is a plane diagram illustrating a pad array 160 according to a second embodiment of the present invention.

In the second embodiment, the pad array 160 is positioned at the same region as that of the serial diode cell array 40 and the circuit device region 150.

An additional mask layer for the pad array 160 is comprised without connecting a metal layer required in the pad array 160 to that used in the circuit device region 160. As a result, an additional space for forming the pad array 160 is not required, thereby reducing the chip size.

Figure 19:
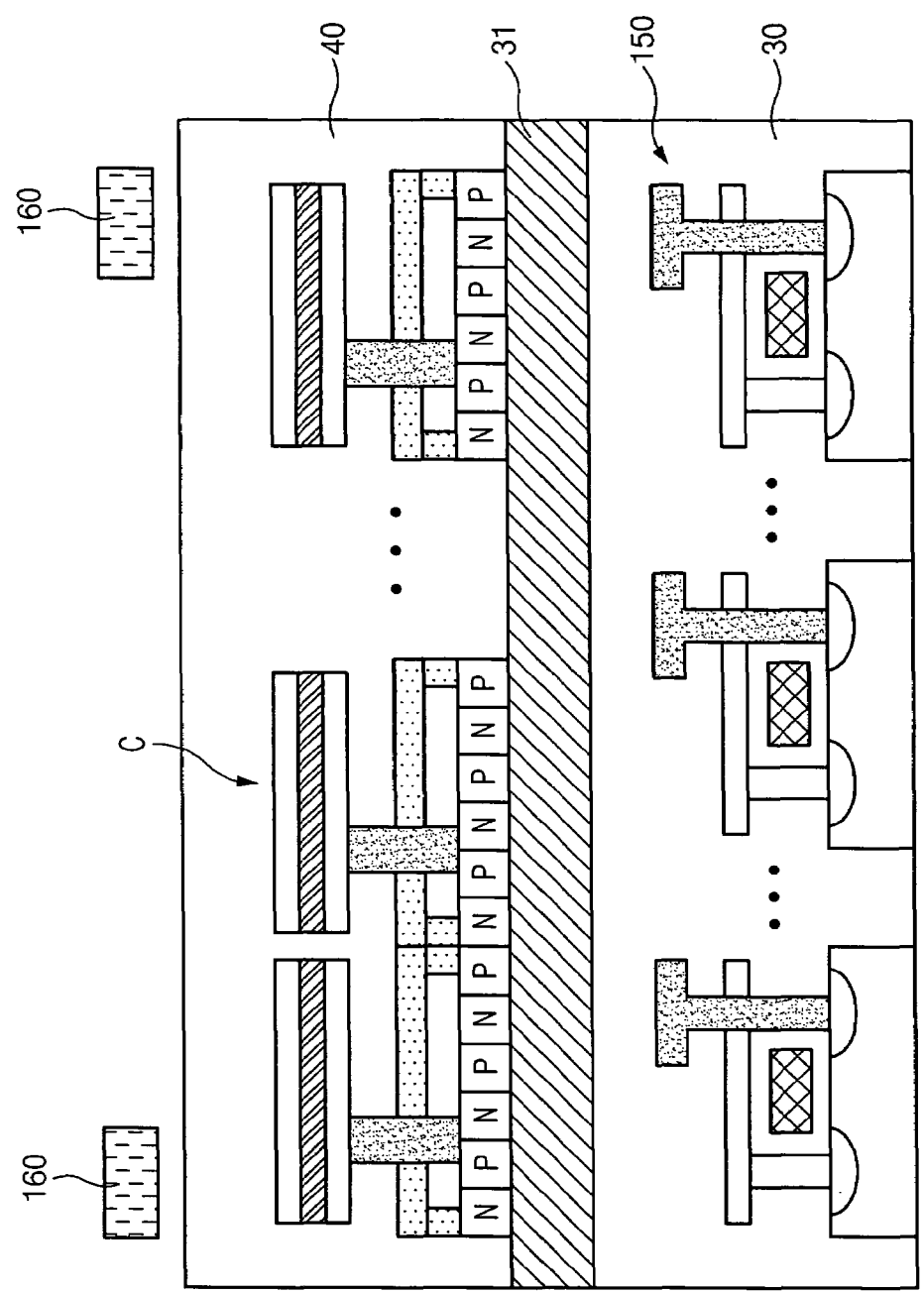
FIG. 19 is a cross-sectional diagram illustrating the pad array of FIG. 19.

FIG. 19 is a cross-sectional diagram illustrating the pad array of FIG. 19.

Referring to FIG. 19, the pad array 160, which is formed on the serial diode cell array 40, uses an additional metal layer.

As discussed earlier, a nonvolatile memory device using a serial diode cell has effects to effectively arrange a serial diode cell array, thereby reducing the whole size of a nonvolatile memory device, and to effectively arrange a pad array on the above-described serial diode cell array, thereby reducing a cell size of the nonvolatile memory device.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile memory device using a serial diode cell, comprising:
   a plurality of serial diode cell arrays each including a plurality of unit serial diode cells arranged in row and column directions;
   a circuit device region, formed on a silicon substrate positioned under the plurality of serial diode cell arrays, for driving the plurality of serial diode cell arrays; and
   an insulating layer for insulating the plurality of serial diode cell arrays from the circuit device region,
   wherein the unit serial diode cell comprises:
   a nonvolatile ferroelectric capacitor whose one terminal is connected to a word line; and
   a serial diode switch, connected between the other terminal of the nonvolatile ferroelectric capacitor and a bit line, comprising two or more diode devices connected in series and the serial diode switch selectively switched depending on a voltage applied to the word line and the bit line.

2. The nonvolatile memory device according to claim 1, wherein the unit serial diode cell further comprises:
   a bit line connected to both nodes of the serial diode switch through a bit line contact node;
   a contact node for coupling a common node connected to two or more of the diode devices with an interval between bottom electrodes of the nonvolatile ferroelectric capacitor; and
   a word line formed on a top electrode of the nonvolatile ferroelectric capacitor.

3. The nonvolatile memory device according to claim 1, wherein the serial diode switch is formed on a silicon layer which is made of polysilicon.

4. The nonvolatile memory device according to claim 1, wherein the serial diode switch is formed on a silicon layer which is made of growth silicon.

5. The nonvolatile memory device according to claim 1, wherein the serial diode switch comprises:
   a PN diode switch connected forward between the bit line and the bottom electrode of the nonvolatile ferroelectric capacitor; and
   a PNPN diode switch connected backward between the bit line and the bottom electrode of the nonvolatile ferroelectric capacitor.

6. The nonvolatile memory device according to claim 5, wherein the PN diode switch has a P-type region connected to the bottom electrode and a N-type region connected to the bit line.

7. The nonvolatile memory device according to claim 5, wherein the PNPN diode switch has an upper N-type region connected to the bottom electrode and a lower P-type region connected to the bit line.

8. The nonvolatile memory device according to claim 1, wherein each of the plurality of serial diode cell arrays comprises:
   a plurality of unit serial diode cells positioned in regions where a plurality of word lines and a plurality of bit lines cross;
   a plurality of bit line pull-down devices connected one by one to the plurality of bit lines.

9. The nonvolatile memory device according to claim 1, wherein the circuit device region comprises:
   a plurality of word line driving units for selectively driving word lines of the plurality of serial diode cell arrays;
   a plurality of sense amplifiers for sensing and amplifying data applied from the plurality of serial diode cell arrays;
   a data bus shared by the plurality of sense amplifiers;
   a main amplifier for amplifying data applied from the data bus;
   a data buffer for buffering amplification data applied from the main amplifier; and
   an input/output port for externally outputting output data applied from the data buffer or transmitting externally applied input data to the data buffer.

10. The nonvolatile memory device according to claim 9, wherein the plurality of sense amplifiers, which are connected one by one to a plurality of bit lines, compare and amplify a reference voltage with voltages of the bit lines when a sense amplifier enable signal is activated.

11. The nonvolatile memory device according to claim 9, wherein the plurality of serial diode cell arrays are divided into a plurality of cell array blocks, and the main amplifier, the data buffer and the input/output port are divided and arranged in each of additional cell array blocks.

12. The nonvolatile memory device according to 1, further comprising a pad array which is arranged in an external region apart from the plurality of serial diode cell arrays and the circuit device region and uses the same metal layer as that of the circuit device region.

13. The nonvolatile memory device according to claim 1, further comprising a pad array, which is formed on a metal layer formed on the plurality of serial diode cell arrays, for exchanging address and data with the outside.

* * * * *